United States Patent [19]

Sullivan

[11] Patent Number: 4,507,847
[45] Date of Patent: Apr. 2, 1985

[54] METHOD OF MAKING CMOS BY TWIN-TUB PROCESS INTEGRATED WITH A VERTICAL BIPOLAR TRANSISTOR

[75] Inventor: Paul A. Sullivan, Fort Collins, Colo.

[73] Assignee: NCR Corporation, Dayton, Ohio

[21] Appl. No.: 391,068

[22] Filed: Jun. 22, 1982

[51] Int. Cl.³ .................. H01L 21/265; B01J 17/00
[52] U.S. Cl. .................. 29/576 B; 29/571; 29/577 C; 148/1.5; 148/187; 357/42; 357/91
[58] Field of Search .................. 357/42, 43, 91; 148/1.5, 187; 29/571, 576 B, 577 C

[56] References Cited

U.S. PATENT DOCUMENTS

| | | | |
|---|---|---|---|
| 3,609,479 | 9/1971 | Lin et al. | 317/235 |
| 3,739,238 | 6/1973 | Hara | 317/235 |
| 4,325,169 | 4/1982 | Ponder et al. | 357/42 |
| 4,346,512 | 8/1982 | Liang et al. | 29/577 C |
| 4,362,574 | 12/1982 | Gevondyan | 29/577 C |
| 4,403,395 | 9/1983 | Curran | 29/571 |
| 4,406,710 | 9/1983 | Davies et al. | 148/1.5 |
| 4,420,344 | 12/1983 | Davies et al. | 148/1.5 |
| 4,420,872 | 12/1983 | Zaldivar et al. | 29/571 |
| 4,434,543 | 3/1984 | Schwabe et al. | 29/576 B |
| 4,435,896 | 3/1984 | Parillo et al. | 29/571 |
| 4,442,591 | 4/1984 | Haken | 29/571 |
| 4,452,645 | 6/1984 | Chu et al. | 148/1.5 |

FOREIGN PATENT DOCUMENTS 24557  2/1982  Japan .................. 357/43

OTHER PUBLICATIONS

Ma et al., IBM-TDB, 16 (1973) 2287.
Chin et al., IBM-TDB, 16 (1973) 1985.
Dorler et al., IBM-TDB, 24 (1981) 466.
Zimmer et al., "A Fully Implanted NMOS, CMOS, Bipolar Technology for VLSI of Analog-Digital Systems", *IEEE Journal of Solid-State Circuits*, vol. SC-14, No. 2, Apr. 1979, pp. 312-318.
Scott et al., "Considerations for Scaled CMOS Source/Drains" IEEE International Electron Devices Meeting 1981, pp. 538-541.
Graul et al., "High-Performance Transistors with Arsenic-Implanted Polysil Emitters", IEEE Journal of Solid-State Circuits, vol. SC-11, No. 4, Aug. 1976, pp. 491-495.
Ning et al., "Effect of Emitter Contact on Current Gain of Silicon Bipolar Devices", IEEE Transactions on Electron Devices, vol. ED-27, No. 11, Nov. 1980, pp. 2051-2055.

*Primary Examiner*—Upendra Roy
*Attorney, Agent, or Firm*—J. T. Cavender; Casimer K. Salys

[57] ABSTRACT

A process for forming high performance npn bipolar transistors in an enhanced CMOS process using only one additional mask level. The bipolar transistor is formed using a low dose blanket implant to form the base in the substrate n-well, then applying arsenic-implanted polysilicon to form the emitter. The emitter formation involves forming a blanket polysilicon layer over the wafer, then using the additional photomask to confine the subsequent arsenic implant to the emitter, n+ and polysilicon contact regions, prior to application of aluminum metallization. The arsenic implanted polysilicon technique provides state-of-the-art bipolar processing as well as improved contact characteristics. The combined polysilicon-aluminum metallization improves step coverage, circuit reliability, and reduces the possibility of aluminum diffusion (spiking) through junctions. The n-type contact resistance is improved by virtue of being implanted with arsenic; the p-type contact resistance is controlled by the diffusion from the p+ regions which dope the polysilicon during the emitter drive-in cycle.

6 Claims, 11 Drawing Figures

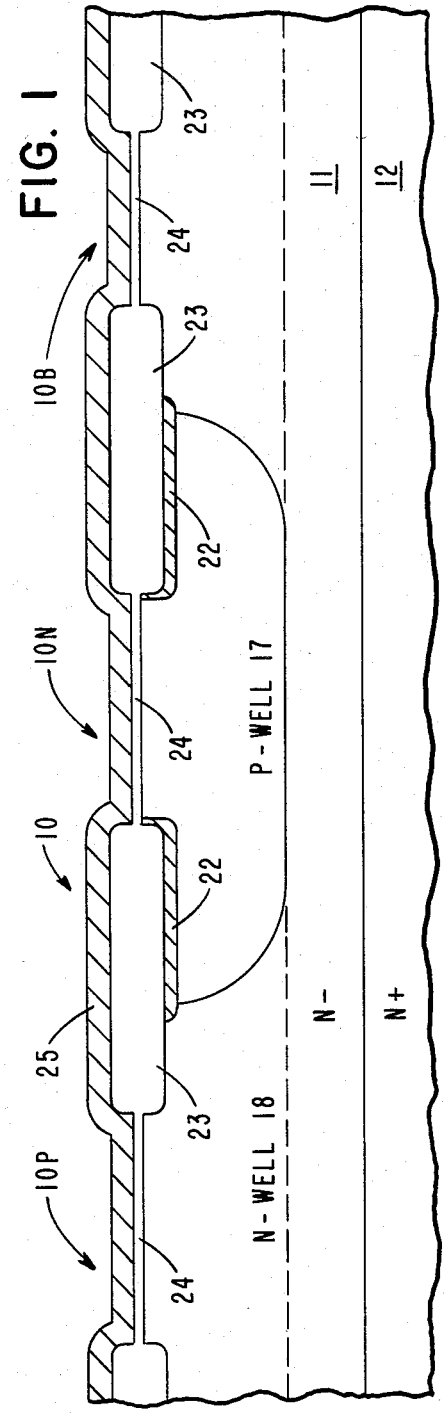
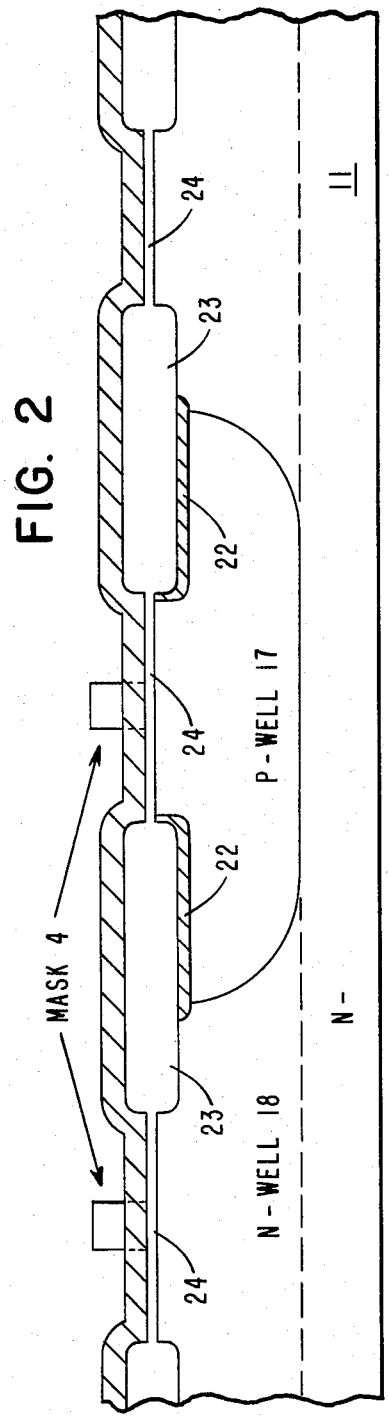

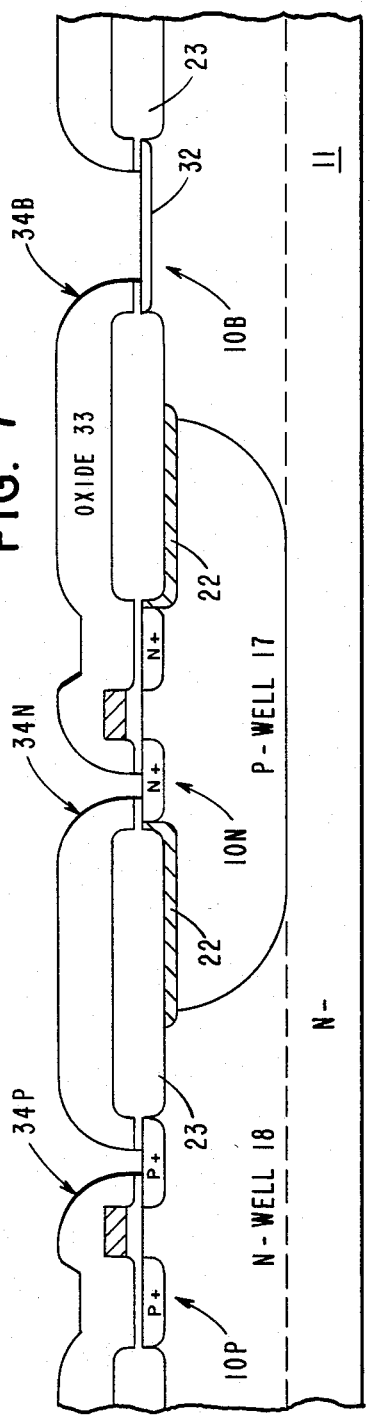
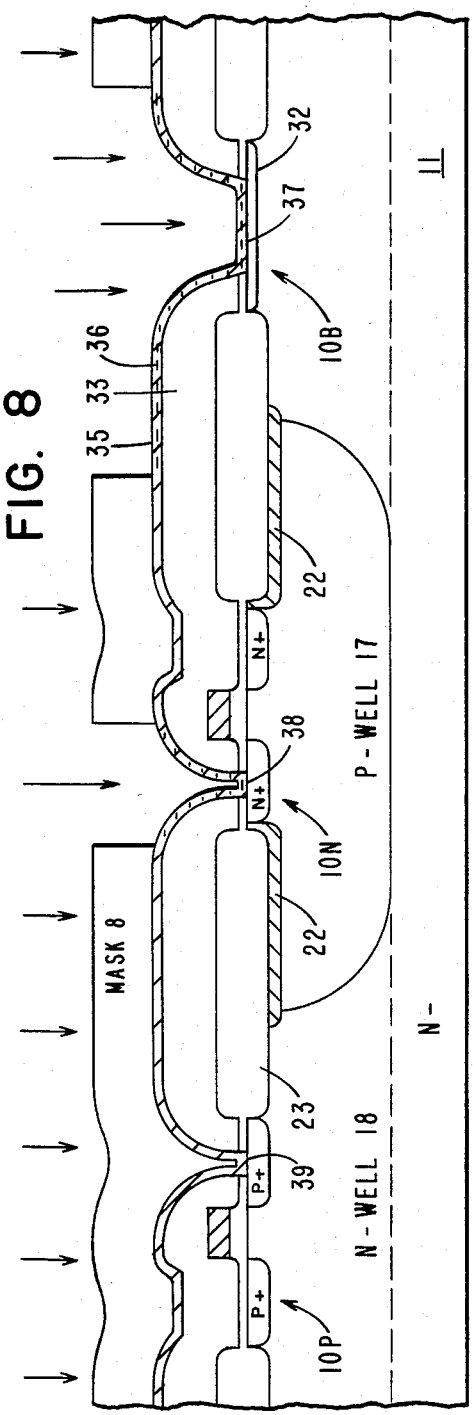

METHOD OF MAKING CMOS BY TWIN-TUB PROCESS INTEGRATED WITH A VERTICAL BIPOLAR TRANSISTOR

BACKGROUND OF THE INVENTION

This invention relates to both CMOS and bipolar devices and fabrication processes therefor and, in particular, to a process for forming high performance bipolar junction transistors in CMOS integrated circuits.

The original development of monolithic integrated circuits was based upon bipolar junction transistors ("BJT") which were built as vertical NPN devices. With further development of the technology to very large scale integrated (VLSI) circuits, the newer metal-oxide-silicon field effect transistor (MOSFET) device has become predominant due to its inherently lower power dissipation and smaller size. In a continuing effort to improve VLSI circuit performance at lower power and lower cost, the industry has evolved from p-channel MOSFETs (PMOS) to n-channel MOSFETs (NMOS) and now to complementary MOS (CMOS=-NMOS+PMOS) circuits and process technologies.

During this evolution of VLSI, the bipolar technologies have dominated most applications that require linear amplification of analog signals. In addition, the bipolar technologies have maintained dominance in those applications that require the utmost in high frequency performance, even at the expense of power dissipation and cost. This dominance is due to the ability of BJTs to rapidly switch relatively large currents with high current gain.

State-of-the-art high performance bipolar junction transistors are described by Graul et al., "High-Performance Transistors with Arsenic-Implanted Polysil Emitters", IEEE Journal of Solid-State Circuits, Vol. SC-11, No. 4, August 1976, pp. 491-495 ("Graul et al"). A primary feature of the fabrication process described by Graul et al. is the formation of the base by a single implantation with boron ions, followed by opening contact windows through a deposited oxide, depositing undoped polycrystalline silicon (hereafter, also "polysilicon") on the water, arsenic implanting the polysilicon, then diffusing the arsenic into the base region to form a shallow emitter and a narrow base width. The advantages of the process, vis a vis conventional double-implanted transistors, include higher current gain, lower base resistance, higher current carrying ability and improved emitter-base breakdown. Since the emitter is formed predominantly in the polysilicon, and since the emitter annealing/diffusion cycle is very brief, the probability of forming emitter-collector shorts due to "diffusion pipes" is minimized and the yield of the process is high.

The excellent current gain of bipolar transistors having shallow emitters was also observed by Ning et al., "Effect of Emitter Contact on Current Gain of Silicon Bipolar Devices", IEEE Transactions on Electron Devices, Vol. ED-27, No. 11, November 1980, pp. 2051-2055 ("Ning et al."). Ning et al. concluded that contact by a thin layer of polycrystalline silicon was a primary factor in the enhanced current gain.

As will be appreciated, certain integrated circuit functions would best be served by combining CMOS and BJT devices in the same monolithic structure. Examples include memory and logic functions, where the CMOS IC is used for all internal circuitry to minimize area and power and the BJTs are used for output buffers to provide high current output from the circuit. Another example is linear circuits, where the CMOS circuits are used for large scale integration, low power, and high input impedance; the BJTs are used in those portions of the circuit requiring matched transistors which precisely track with temperature and have low differential offset voltages. Still other examples are field programmable logic arrays (FPLA) and programmable read only memories (PROM). The CMOS circuits are used for low power peripheral logic and the high current gain BJTs are used to provide sufficient current to blow the programmable fuse links.

Not unexpectedly then, integrated circuit fabrication processes have been developed which allow the fabrication of both CMOS and bipolar devices on the same chip. However, the potential usefulness of the combined integrated circuits due to the unique characteristics of CMOS and bipolar devices is typically achieved at the expense of process complexity and device density. This is believed particularly true where the combined process is derived from bipolar processes. In addition, the combination of the MOS and BJT processes frequently results in sacrifice or compromise in the performance of either or both types of devices.

Perhaps one of the better processes achieved to data is described in Zimmer et al. "A Fully Implanted NMOS, CMOS, Bipolar Technology For VLSI of Analog-Digital Systems," IEEE Journal of Solid-State Circuits, SC-14, No. 2, pp. 312-318 (April, 1979). The Zimmer et al. process is an extension of NMOS technology which involves forming the PMOS transistors and npn bipolar transistors in separate n-wells. This process has the advantage of providing isolated npn transistors, and of being relatively simple. The process is metal gate, however, which compromises performance, and uses a deposited field oxide, which requires relatively large device spacing.

SUMMARY OF THE INVENTION

With the above in mind, it is a primary object of the present invention to modify state-of-the-art CMOS processing to obtain state-of-the-art bipolar junction transistors having the characteristics described by Graul et al. and Ning et al., in a monolithic circuit structure which includes CMOS devices and to do so with minimum additional process complexity and without sacrificing performance, packing density, or other characteristics of the CMOS devices.

The above objective is achieved, along with improvements to the resulting CMOS circuits, using the following fabrication approach.

Prior to application of the steps which are unique to the present invention, an isolation field oxide is formed on a silicon wafer to define active regions for the NMOS, PMOS and bipolar devices. The NMOS and PMOS structures (gate oxide, polysilicon gate, source and drain) are then formed within opposite conductivity type wells of the wafer.

In the initial step of the process sequence which is unique to this invention, the wafer is given a low dose, blanket p-type implant, which, with subsequent diffusion, defines the base for the bipolar junction transistor within an existing opposite conductivity-type region (n-type). An interlayer dielectric layer is then formed on the wafer and is provided openings to selected substrate contact regions. These include the bipolar base, the first layer polysilicon gates and interconnects, and the n+ and p+ substrate contact regions. A polysilicon layer is formed over the wafer, in contact with the selected substrate regions, and is implanted with arsenic in regions thereof corresponding to the n+ substrate contact regions, the first layer n-type polysilicon, and the emitter region. A brief thermal cycle anneals the arsenic ion implant damage and forms the emitter region from the arsenic implanted polysilicon. A conductor layer such as aluminum is then formed on the polysilicon and the two layers are selectively formed into a dual-layer interconnection pattern. Subsequently, additional interlayer insulators and conductors may be formed prior to formation of a dielectric passivation layer.

The above-outlined modified CMOS process requires only one extra mask step—the mask for the emitter-forming arsenic implant of the polysilicon—to provide high performance npn bipolar transistors as well as NMOS and PMOS transistors. The resulting bipolar transistor(s) has the excellent current gain described by Graul et al. and Ning et al., and the base resistance, current-carrying ability and emitter-base breakdown characteristics described by Graul et al. Other advantages, not exclusive, are as follows. The use of polysilicon between the contact aluminum and the substrate reduces the possibility of a shallow junction short caused by aluminum diffusion (spiking) through the junction. All n-type contacts are implanted with arsenic, thereby improving the contact resistance. The process effects a carefully balanced relationship among the p+ doping concentration, the polysilicon thickness, and the emitter drive-in cycle so that out-diffusion from the p+ regions dopes the polysilicon associated with these regions to a low resistance.

BRIEF DESCRIPTION OF THE DRAWINGS

FIGS. 1-11 are cross-sectional representations of a combined bipolar-CMOS integrated circuit during different sequential stages of fabrication using the method of the present invention.

DETAILED DESCRIPTION

Figure 3:
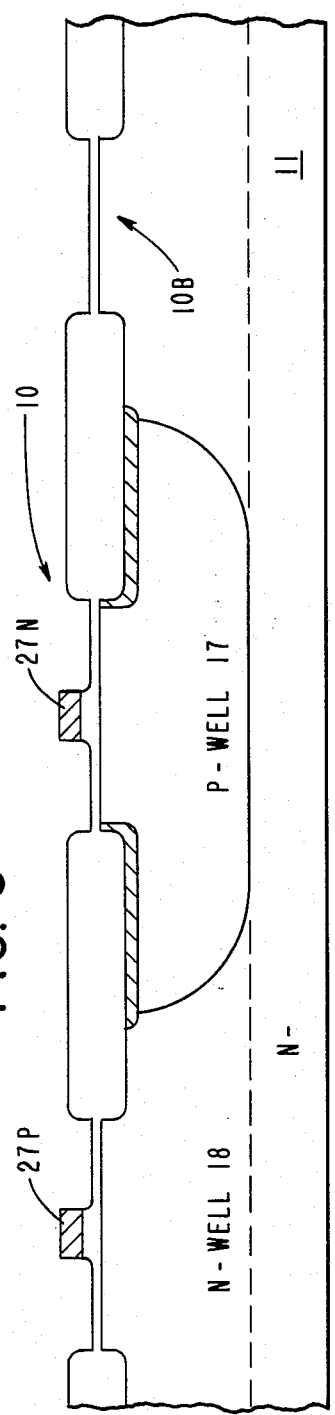

As mentioned, the present process combines high performance BJT devices as well as CMOS devices by adding only one additional mask level to standard CMOS processes. The exemplary process features silicon wafers of one conductivity-type, i.e. n-type, wells of the opposite conductivity type, i.e., p-wells, and vertical NPN devices fabricated in n-type substrate regions. Alternatively, the substrate could be p-type, with an n-well with the NPN BJT isolated in its own n-type well. This latter arrangement is advantageous for some circuit applications, such as linear amplifiers, where isolated contacts to the BJT collector region are required. Also, the process could be readily modified to provide vertical PNP BJTs in p-type substrate or p-well regions. It should be noted that fabrication of both NPN and PNP devices in the same circuit requires additional process steps. This is accomplished, e.g., by separately masking the base implants and providing an additional p+ emitter implant mask.

Referring to FIG. 1, the illustrated starting point for application of the present process is a point intermediate to the overall process of forming a CMOS circuit. As illustrated, the partially-completed BJT/CMOS circuit 10, is based upon an epitaxial, 5-micron thick (typically can be 5 to 10 micron thick), lightly doped n-type layer 11 of 10 ohm-cm resistivity (typically 1 to 20 ohm-cm) formed on a heavily doped n-type substrate 12 such as 0.01 ohm-cm. antimony- or arsenic-doped silicon. (To preserve drawing space, substrate 12 is not shown in FIGS. 2-11.). This structure minimizes collector resistance in the BJT and minimizes latch-up of the CMOS structures. The present process has also been successfully applied to bulk silicon wafers, but the 10 ohm-cm. epitaxial layers are preferred to minimize collector resistance and latch up.

The intermediate structure shown in FIG. 1 has surface-adjacent p-well 17 and n-well 18. Actually, although "n-well" is used for simplicity of nomenclature here, 18 is more precisely termed an n-type surface-adjacent region; p-well 17 is formed within this region. Both p-well 17 and n-well 18 are formed within the 10 ohm-cm epi (epitaxial) region 11. Thick field isolation oxide regions 23 define active areas 10P, 10N, 10B for the subsequently-formed PMOS and NMOS complementary devices and the NPN bipolar device, respectively. Polysilicon layer 25 covers the wafer 10.

The various approaches for fabricating the intermediate structure 10, FIG. 1, will be readily apparent to those skilled in the art. However, to briefly describe one such approach, the upper surface-adjacent region of the epi region 11 is given a phosphorus implant for ultimately forming the n-well 18. An oxide layer is deposited/grown, then formed into a mask (first mask step), typically a photoresist mask, to delineate the p-well region. The p-well region 17 is then doped with boron, by diffusion or ion implantation. The wafer is given a thermal drive-in to diffuse the p-well 17 and n-well 18 to a depth of 3 to 6 microns. After stripping the first, oxide mask, a dual-layer mask of oxide and nitride is provided, typically by growing the oxide layer, depositing the nitride layer, and forming the nitride into a mask (second mask step) that covers the active regions 24. That is, the mask is removed in the field oxide regions 23-23. Prior to oxidation of the field regions, a third photomasking step is used to delineate the p-well field regions 22 and the regions are implanted using boron, to improve the field inversion threshold. Next, the aforementioned second and third photomasks are removed and the isolation oxide 23 is grown in the field regions in the presence of the oxide-nitride mask. Subsequently, the dual-layer oxide-nitride mask is removed and gate oxide layer 24 is grown in the active device regions to a thickness of, for example, 650 Angstroms (0.065 micron). The wafer is then given a blanket implant to adjust the ultimate n-channel and p-channel threshold voltages to the desired values. The FIG. 1 structure is completed by depositing on the wafer a polycrystalline silicon layer 25, typically about 0.5 microns thick, and doping the polysilicon using n-type dopant such as phosphorus to provide the desired conductivity.

Referring to FIGS. 2 and 3, next the fourth photomask is applied to the polysilicon and the polysilicon is etched by plasma or a wet chemical etchant. This procedure forms the polysilicon areas such as the PMOS and NMOS gates 27P and 27N. As shown in FIG. 3, all polysilicon is removed from the bipolar device region 10B. The fourth mask is removed and the gate oxide is etched back to a thickness of about 400 Angstroms (0.04 micron) to allow ion implant penetration.

Figure 4:
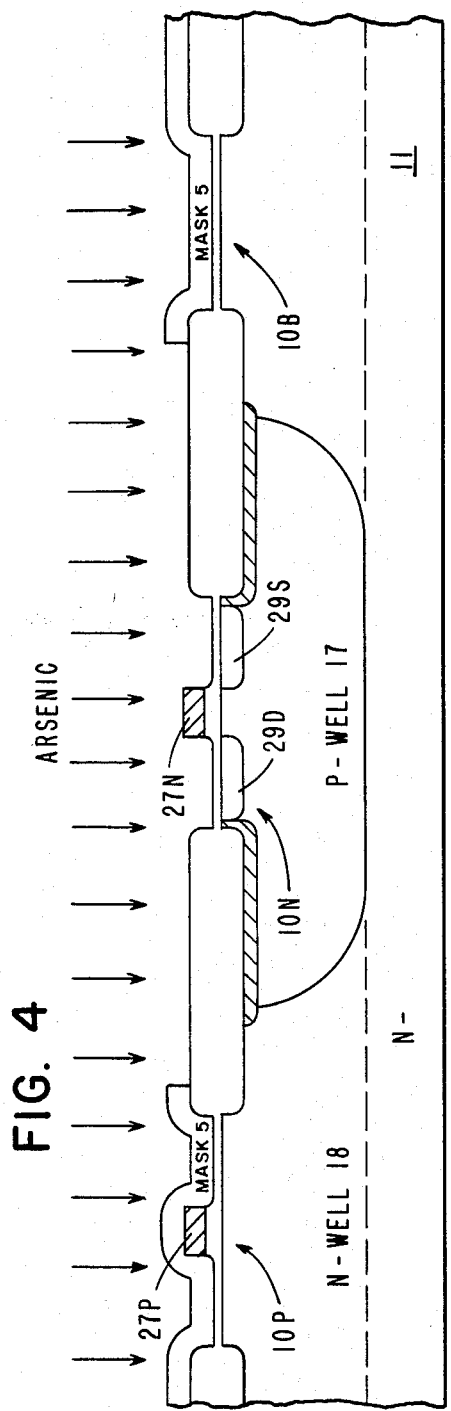
Figure 5:
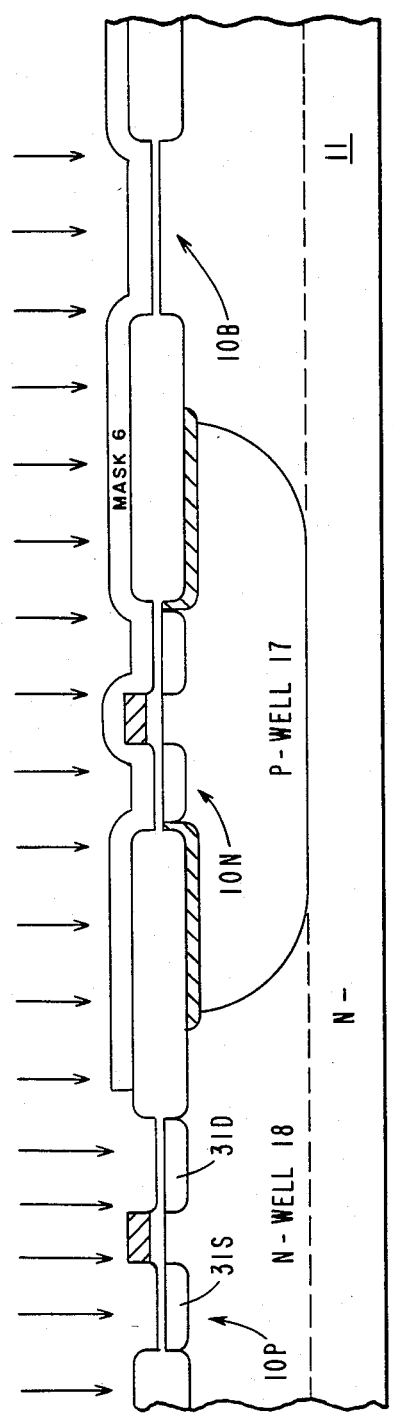

The fifth photomask, FIG. 4, is applied to delineate the NMOS device areas, then the devices are implanted with arsenic (or phosphorus) to form source 29S and drain 29D which are self-aligned with the gate 27N of NMOS device 10N. After the photoresist mask is stripped, a furnace cycle may be used to diffuse the n-type dopant to the desired junction depth. To achieve a junction depth of 0.5 microns, we have used a blanket arsenic implant of $5 \times 10^{15}$ cm$^{-2}$, 80 keV, followed by a 1,000° C., 150 minute furnace diffusion cycle.

A corresponding sequence is next used to form the self-aligned source and drain 31S and 31D of PMOS device 10P. That is, and referring to FIG. 5, the sixth photomask is used to delineate the PMOS device area, then boron is implanted and the photoresist mask is stripped. We have used a $5 \times 10^{15}$ cm$^{-2}$, 30 keV boron blanket implant. PMOS junction depths were 0.7 microns after a subsequent 950° C., 15 minute furnace diffusion cycle. This sequence simultaneously implants the base contact region (not shown) of the BJT and the p-well contact regions (not shown).

Figure 6:
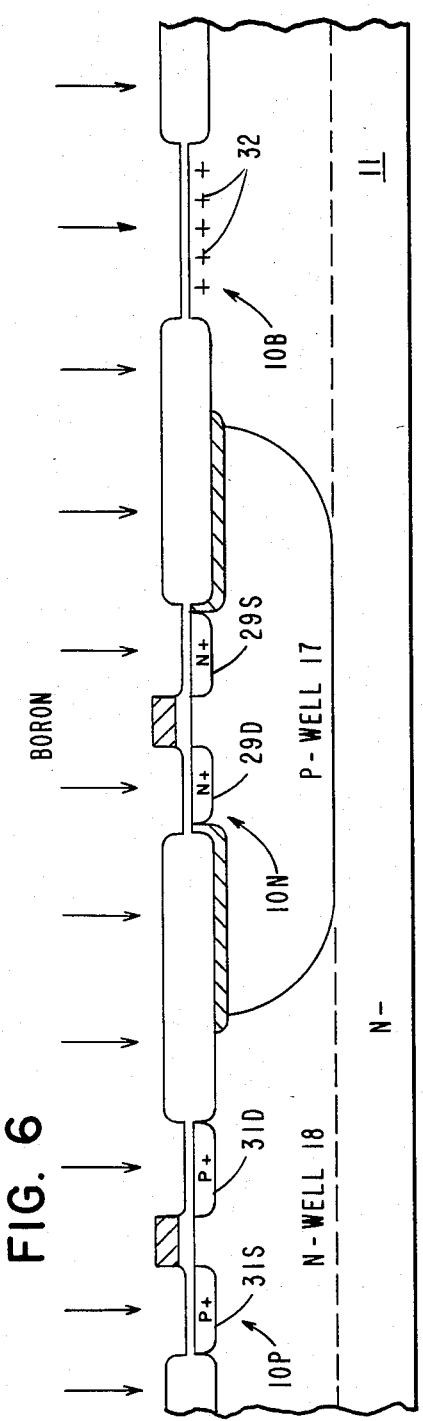
Figure 9:
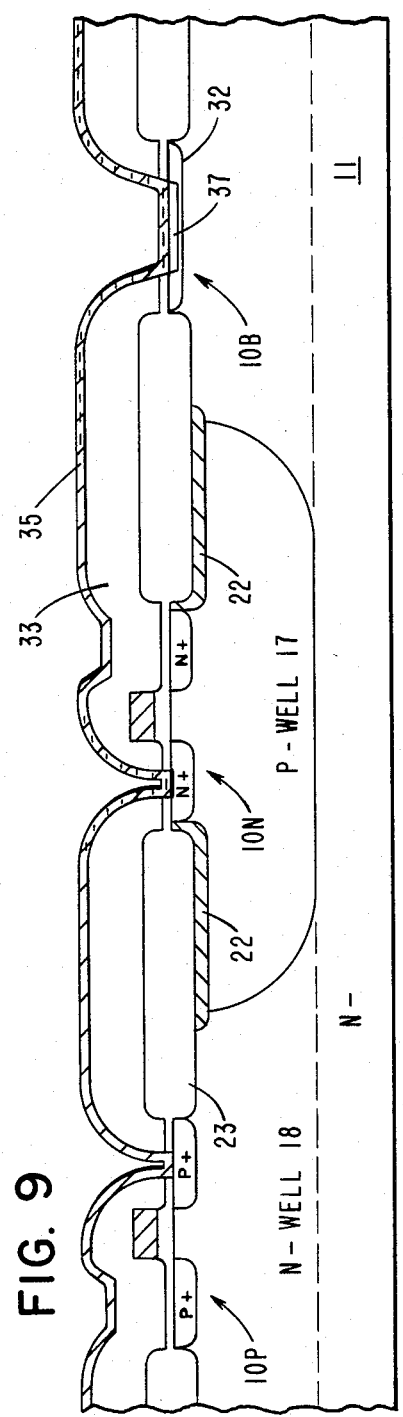

Referring now to FIG. 6, after the sixth photomask is stripped, but prior to the boron annealing furnace cycle, the wafer is subjected to a p-type blanket implant to form the base region 32 of the NPN BJT. This crucial step utilizes a low implant dose to form the base region, without affecting the other, heavily doped n+ and p+ regions. The implant is, for example, $1 \times 10^{13}$ to $5 \times 10^{14}$ cm$^{-2}$, 30 keV boron. This dose is less than 10% of that used for the n+ and p+ regions previously formed, and thus is of negligible influence in adjusting their concentration. Consequently, no photomask is needed.

Also, although it might be expected that the boron 32 would diffuse deeper than the n+ regions 29S and 29D, such is not the case. It has been shown by Scott et al. "Considerations for Scaled CMOS Source/Drains" International Electron Devices Meeting, December 1981, page 538, that a relatively high arsenic concentration suppresses diffusion of the subsequent boron p+ implant. This phenomenon is utilized here, in that the relatively high dose and resulting dopant concentration of n+ regions 29S and 29D ($5 \times 10^{15}$ cm$^{-2}$ arsenic) was used to suppress diffusion of the p+ base implant ($1 \times 10^{14}$/cm$^2$ boron). Complete freedom is allowed to adjust the boron implant dose between $1 \times 10^{13}$ to $5 \times 10^{14}$ cm$^{-2}$ and the energy between 10–40 keV, or even to use two boron implants of different energies in order to produce the optimum base doping profile in region 10B. The boron implant energy should be limited to 40 keV or less so that the boron does not go deeper than the n+ regions 29S and 29D. In fact, however, this is desirable in that it facilitates producing a narrow base width, d, FIG. 11, which in turn is desirable for high frequency operation of the BJT 10B.

Following the base implant, a brief thermal cycle (950° C., 15 min.) may be used to anneal the ion implant damage and to grow an insulating oxide layer (0.1 micron) on the polysilicon gates. This oxide layer helps provide better dielectric integrity between the polysilicon and the subsequently-deposited metal. As shown in FIG. 7, an interlayer 33 (0.7 microns thick silicon dioxide) is deposited on the wafer, typically using chemical vapor deposition and atmospheric pressure, low pressure or plasma-enhanced deposition techniques. A seventh photomask (not shown) delineates the contact locations in the deposited oxide, contact cuts or windows are etched as by a buffered solution of ammonium fluoride and hydrogen fluoride, and the photoresist is stripped.

Figure 11:
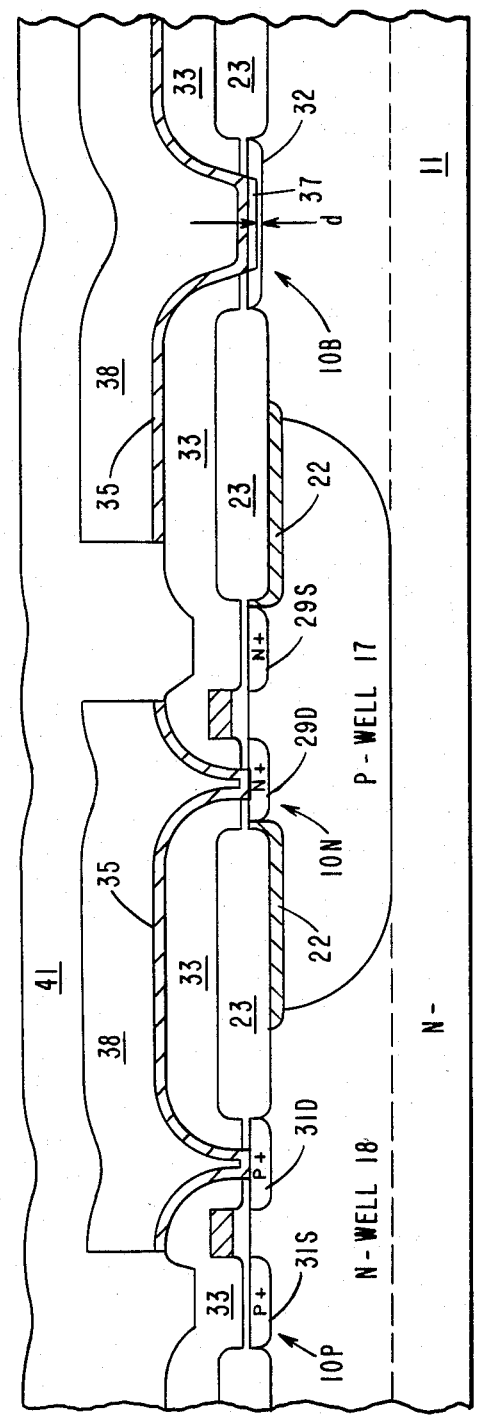

It should be noted that FIG. 7 illustrates three contact cuts. Cut 34B will define the emitter window of the NPN BJT device 10B, while 34N and 34P are for the NMOS and PMOS devices, respectively. As shown in FIG. 11, cuts 34N and 34P will ultimately provide for connection of the PMOS and NMOS drains, as is frequently done in CMOS inverters. However, it should be noted that it is highly unlikely that the contact cuts 34N, 34P, 34B would be in the same plane in the manner illustrated; rather, it should be understood that these contacts cuts and the resulting contacts are used to conveniently represent implementation of the present process from a single graphical perspective.

Additional contact cuts not shown in FIG. 7 include the contact cuts to the NMOS and PMOS source regions and the polysilicon gates; contacts to the p-well and substrate regions; and contact to the base of the BJT.

The next process steps are used to implement state-of-the-art bipolar transistor technology, including the arsenic-implanted polysilicon emitters described in the previously-mentioned Graul et al. and Ning et al. articles. Referring to FIG. 8, a layer 35 of undoped polysilicon (0.1 microns thickness) is deposited on the wafer, the eighth photomask is employed to delineate or expose the polysilicon regions corresponding to the BJT emitter 37, and all n+ contact regions, such as contact region 38, as well as the polysilicon contact regions (not shown). The exposed polysilicon regions are implanted through mask 8 with n-type dopant 36 (arsenic, $5 \times 10^{15}$ to $2 \times 10^{16}$ cm$^{-2}$, 80 keV).

After stripping the eighth photoresist mask, a short thermal cycle (950° C., 30 minutes; typically $\geq$850° C., $\leq$60 min.) anneals the ion implant damage, diffuses the arsenic to a depth of approximately 0.1 to 0.2 microns from the top surface of the polysilicon to form the emitter 37, and activates the electrical conductivity of this emitter region. See FIG. 9. This thermal cycle also ensures improved contact to the n+ contacts 38 and the first layer polysilicon contacts (not shown).

Figure 10:
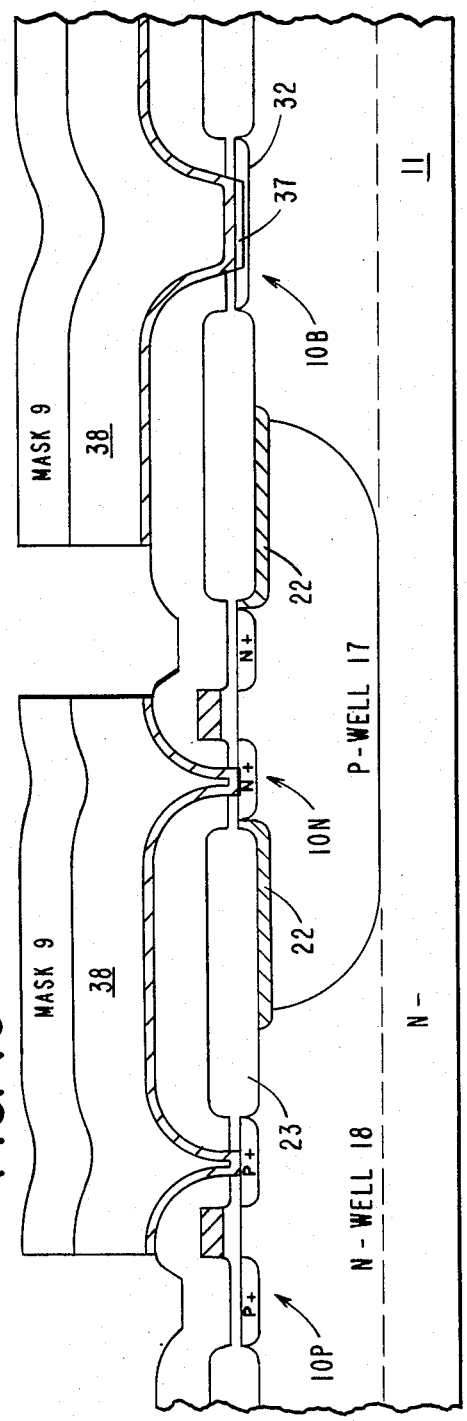

As shown in FIG. 10, a conductor layer 40 such as aluminum is deposited on the wafer and is etched in the presence of the ninth photomask to define interconnections. The water is then dip-etched (10 seconds in a polysilicon etchant), or plasma etched, to everywhere remove the polysilicon except under the aluminum interconnections and then the ninth photomask is removed.

Referring to FIG. 11, passivation layer 41 is next deposited. The FIG. 11 structure is shown for simplicity, for as will be appreciated by those skilled in the art, it may be the more usual process to form additional interlayer dielectrics and additional metal interconnection layers prior to the final passivation layer 41. Finally, a tenth photomask is used to define openings in the passivation layer 41 over metal bonding pads, the photomask is removed, and an alloying heat treatment is applied.

The above process provides the fabrication of a high performance, common-collector NPN bipolar transistor 10B in a CMOS process with minimum additional process complexity. The exemplary bipolar transistor 10B has an emitter 37 formed by arsenic doping from polysilicon (contact) layer 35, narrow-width base 32, and utilizes the n-well 18 as collector. This bipolar transistor has numerous advantages. These include an optimized base doping profile which can be tailored to produce a current gain, beta, of 10–1,000. Also, a narrow base region width, d, FIG. 11, typically 0.2 microns, provides a very short transit time. A self-aligned emitter region was formed by the process of depositing polysilicon into the emitter contact window, then doping the emitter via the polysilicon. The gain-bandwidth product of the resulting transistor has been demonstrated to be as high as 4 GHz. at a current of 2 mA for a 3 micron×12 micron emitter, and as high as 3 GHz at a current of 30 mA for an 8 micron×47 micron emitter. With a 30 keV boron base implant dose of $8\times10^{12}$ to $4.8\times10^{14}$ cm$^{-2}$, a current gain (beta) of 1000 to 10 was demonstrated. The reverse breakdown voltage of the emitter-base junction was 6 volts and the emitter-collector breakdown voltage was 10–30 volts.

In addition to the above-mentioned desirable characteristics of high gain and precise control of base width, the arsenic-implanted polysilicon emitter has the advantage of decreased parasitic capacitance, abrupt base-emitter junction, decreased emitter-collector shorts, and ease of fabrication.

In terms of process complexity, the present bipolar CMOS process provides for the formation of an optimized base region without a special mask level via the use of the low dose, low energy, base implant, and the formation of an optimized doped polysilicon emitter region with only one additional mask level beyond conventional CMOS processing.

As discussed, the resulting bipolar transistor is one of high performance; at the same time however, the process in no way compromises the performance of the resulting CMOS structures. In fact, the addition of polysilicon under the aluminum metallization enhances the overall integrated circuit reliability and step coverage. The presence of the polysilicon between the metal and the contact regions reduces the possibility of a junction short caused by aluminum diffusion (spiking) through the shallow junction. All of the n-type contacts (n+, and poly as well as emitter) are implanted with arsenic, thereby improving (decreasing) the contact resistance. In addition, the invention also features a carefully balanced relationship among three parameters affecting the p+ contact regions: the p+ doping concentration, the second layer polysilicon thickness (0.05 microns to 0.5 microns), and the emitter drive-in cycle. These are designed such that a sufficient amount of boron will out-diffuse from the p+ regions during the emitter drive-in cycle to dope the polysilicon in these contacts to a desirable low resistance. Contact resistance in this process has been demonstrated to be less than 20 ohms in a 3 micron by 4 micron n+ contact and less than 80 ohms in a 3 micron by 4 micron p+ contact.

Process tolerances are improved by metallizing with aluminum, which enhances contact to p-type silicon, even if lightly doped.

Those skilled in the art will readily appreciate that, by altering the conductivity types of the base and emitter regions, and placing them in a p-well region, one can readily produce a vertical pnp transistor using the present modified CMOS process.

Improvements to this basic process can be obtained by adding an additional mask level after the eighth mask level to implant the p+ contact regions. Such a mask level would also allow the formation of emitter regions for vertical pnp transistors if separate masks were used to define the p-type and n-type base regions of the npn and pnp transistors, respectively. Also, by proper choice of the conductivity type of the epi layer, the heavily doped substrate, and the well regions, various schemes are possible to provide isolated npn and pnp devices.

Having thus described a preferred embodiment of the present invention, what is claimed is:

1. A process for forming complementary metal oxide semiconductor devices and vertical bipolar junction transistors in the same wafer comprising:
   forming opposite conductivity-type, n-type and p-type, surface-adjacent regions in the wafer;
   forming an isolation oxide on the wafer to define locations for n-channel, p-channel and bipolar transistor devices;
   forming self-aligned, silicon gate, n-channel and p-channel MOS devices within the opposite conductivity-type, surface-adjacent regions of the wafer;
   forming a bipolar junction transistor base of one conductivity type in a surface-adjacent region of opposite conductivity type by imparting a low dose, blanket implant to the wafer, the dose being less than 10% of that of the implant dose used for the source and drain regions of the MOS devices;
   forming on the wafer an interlayer dielectric layer having openings to selected contact regions including a defined emitter window over the bipolar junction transistor base and including openings to the doped substrate regions associated with the MOS devices;
   forming a silicon layer on the wafer of 0.05 microns to 0.5 microns thickness, the layer making contact with the selected contact regions and the contact area thereof with the base delineating an emitter region of the bipolar junction transistor;
   selectively implanting with a dopant, of opposite conductivity type to that of the base region, the contact-associated regions of the emitter and selected underlying contact regions of the same conductivity type as the emitter;
   diffusing the base and emitter regions to predetermined junction depths;
   depositing a layer of metal on the silicon;
   selectively patterning the dual-layer of metal-silicon to form interconnections therefrom; and
   forming a passivation layer over the wafer.

2. The process of claim 1 wherein the wafer comprises a silicon epitaxial layer of approximately 5 to 10 micron thickness and approximately 1 to 20 ohm-cm resistivity on a substrate of lower resistivity.

3. The process of claim 1 or 2 wherein the source and drain regions of the NMOS device are formed by implantation of arsenic or phosphorus, wherein the implant dose for the NMOS device and the PMOS device is $1\times10^{15}$ to $1\times10^{16}$ cm$^{-2}$, and wherein the base implant dose is $1\times10^{13}$ to $5\times10^{14}$ cm$^{-2}$.

4. The process of claim 1 or 2 wherein the source and drain regions of the NMOS device are formed by implantation of arsenic or phosphorus, wherein the implant dose for the NMOS device and the PMOS device is $1\times10^{15}$ to $1\times10^{16}$ cm$^{-2}$, wherein the base implant dose is $1\times10^{13}$ to $5\times10^{14}$ cm$^{-2}$, and wherein the emitter implant dose is $5\times10^{15}$ cm$^{-2}$ to $2\times10^{16}$ cm$^{-2}$.

5. The process of claims 1 or 2 wherein prior to forming the passivation layer, at least an additional interlayer dielectric layer and an additional interconnection layer is formed on the wafer.

6. A process for forming complementary metal oxide semiconductor devices and a vertical bipolar junction transistor in the same wafer, comprising:
   forming opposite conductivity-type, n-type and p-type, surface-adjacent regions in the wafer;
   forming an isolation oxide on the wafer to define locations for n-channel and p-channel devices and at least a bipolar junction transistor device;

forming self-aligned, silicon-gate, n-channel and p-channel MOS devices within the opposite conductivity-type, surface-adjacent regions of the wafer, the source and drain regions of said MOS devices being formed by ion implantation;

forming a bipolar p-type base in the n-type surface-adjacent region of the wafer by imparting a low dose, blanket implant to the wafer, the dose being less than 10% of that used to form the source and drain regions of the n-channel MOS device;

forming on the wafer an interlayer dielectric layer having openings to selected contact regions including a defined emitter window over the base and including openings to the substrate regions associated with the MOS devices;

forming a polycrystalline silicon layer on the wafer of 0.05 microns to 0.5 microns thickness, the layer making contact with the selected contact regions, and the contact area thereof with the base delineating an emitter region of the bipolar junction transistor;

selectively implanting with n-type dopant the contact-associated regions of the emitter and selected underlying n-type contact regions;

depositing a layer of metal on the polysilicon;

selectively patterning the dual-layer of metal-polysilicon to form interconnections therefrom; and forming a passivation layer over the wafer.

* * * * *